(12) United States Patent
Orme-Marmerelis et al.

(10) Patent No.: US 6,520,402 B2
(45) Date of Patent: Feb. 18, 2003

(54) HIGH-SPEED DIRECT WRITING WITH METALLIC MICROSPHERES

(75) Inventors: Melissa Orme-Marmerelis, Irvine, CA (US); Robert F. Smith, Costa Mesa, CA (US)

(73) Assignee: The Regents of the University of California, Oakland, CA (US)

(*) Notice: Subject to any disclaimer, the term of this patent is extended or adjusted under 35 U.S.C. 154(b) by 0 days.

(21) Appl. No.: 09/860,798

(22) Filed: May 18, 2001

(65) Prior Publication Data

US 2002/0043552 A1 Apr. 18, 2002

Related U.S. Application Data

(60) Provisional application No. 60/206,508, filed on May 22, 2000, and provisional application No. 60/278,495, filed on Mar. 23, 2001.

(51) Int. Cl.$^7$ ............................................... B23K 31/02
(52) U.S. Cl. ........................... 228/260; 228/33; 228/262
(58) Field of Search ................................ 228/256, 257, 228/258, 259, 260, 261, 262, 33, 37

(56) References Cited

U.S. PATENT DOCUMENTS

| | | | |
|---|---|---|---|
| 4,068,241 A | 1/1978 | Yamada | 346/75 |
| 4,288,797 A | 9/1981 | Horike et al. | 346/75 |
| 4,734,705 A | 3/1988 | Rezanka et al. | 346/1.1 |
| 5,171,360 A | 12/1992 | Orme et al. | 75/331 |
| 5,226,948 A | 7/1993 | Orme et al. | 75/331 |
| 5,259,593 A | 11/1993 | Orme et al. | 266/78 |
| 5,266,098 A | 11/1993 | Chun et al. | 75/335 |
| 5,340,090 A | 8/1994 | Orme et al. | 266/202 |
| 5,407,458 A | 4/1995 | König et al. | 75/255 |
| 5,415,679 A * | 5/1995 | Wallace | |
| 5,432,541 A | 7/1995 | Pickell et al. | 347/74 |
| 5,445,666 A | 8/1995 | Peschka et al. | 75/335 |
| 5,520,715 A | 5/1996 | Oeftering | 75/335 |
| 5,597,110 A * | 1/1997 | Melton et al. | |
| 5,646,663 A * | 7/1997 | Clark et al. | |
| 5,722,479 A | 3/1998 | Oeftering | 164/46 |
| 5,746,844 A | 5/1998 | Sterett et al. | 148/522 |
| 5,772,106 A * | 6/1998 | Ayers et al. | |
| 5,779,971 A * | 7/1998 | Tsung Pan et al. | |
| 5,810,988 A | 9/1998 | Smith, Jr. et al. | 204/666 |
| 5,855,232 A * | 1/1999 | Yost et al. | |
| 5,861,323 A | 1/1999 | Hayes | 438/111 |
| 5,868,305 A * | 2/1999 | Watts, Jr. et al. | |
| 5,891,212 A | 4/1999 | Tang et al. | 75/335 |
| 5,894,980 A | 4/1999 | Orme-Marmarelis et al. | 228/33 |
| 5,894,985 A | 4/1999 | Orme-Marmarelis et al. | 228/262 |
| 5,938,102 A | 8/1999 | Muntz et al. | 228/102 |
| 5,960,853 A | 10/1999 | Sterett et al. | 164/271 |
| 6,007,183 A | 12/1999 | Horine | 347/46 |
| 6,015,083 A * | 1/2000 | Hayes et al. | |
| 6,027,699 A | 2/2000 | Holcomb et al. | 422/186.04 |

(List continued on next page.)

*Primary Examiner*—Tom Dunn
*Assistant Examiner*—Kiley Stoner

(57) ABSTRACT

Ultra-small satellite droplets of molten metal, generated from capillary stream break-up, are selectively directed to predetermined locations on a substrate. The satellite droplets are produced at a high rate and are highly uniform because of the nature of capillary stream break-up. Applied harmonic disturbances are used to control and generate the satellite and parent droplets. The satellite droplets are electrostatically charged on a droplet-by-droplet basis and are then deflected by, e.g., an electric field to predetermined locations on a substrate. The substrate is moveable, attached to an x-y table, for facilitating the placement of satellite droplets on the substrate. The satellite droplets can be placed in individual locations on the substrate (e.g., for forming a ball grid array) or can be overlapped to form conductive traces. Because the satellite droplets have small diameters, these traces may have correspondingly small widths or pitches.

5 Claims, 3 Drawing Sheets

U.S. PATENT DOCUMENTS

| | | | |
|---|---|---|---|
| 6,029,896 A | * | 2/2000 | Self et al. |
| 6,076,723 A | * | 6/2000 | Tsung Pan |
| 6,082,605 A | | 7/2000 | Farnworth .................. 228/33 |
| 6,114,187 A | * | 9/2000 | Hayes |
| 6,186,192 B1 | | 2/2001 | Orme-Marmarelis et al. . 141/18 |
| 6,224,180 B1 | | 5/2001 | Pham-Van-Diep et al. ..... 347/2 |
| 6,264,090 B1 | * | 7/2001 | Muntz et al. |
| 2001/0048017 A1 | * | 12/2001 | Farnworth |

* cited by examiner

HIGH-SPEED DIRECT WRITING WITH METALLIC MICROSPHERES

This application is related to U.S. applications Ser. Nos. 09/860,802 and 09/860,803, filed May 18, 2001, the contents of which are hereby fully incorporated by reference. This application is related to provisional U.S. application Ser. No. 60/206,508, filed May 22, 2000, and provisional U.S. application Ser. No. 60/278,495, filed Mar. 23, 2001, the contents of which are hereby filly incorporated by reference.

This invention was made with Government support under Grant No. DMI-9457205, awarded by NSF. The Government has certain rights in this invention.

FIELD OF THE INVENTION

The invention relates generally to the placing of conductors on a substrate (e.g., circuit board writing) and, in particular, to placing very fine metallic spheres on a substrate using capillary stream break-up.

BACKGROUND OF THE INVENTION

Methods of circuit board printing include traditional etching, chemical vapor deposition, focused ion beam writing, micropen direct writing, and drop-on-demand dispensing. Additionally, U.S. Pat. 5,938,102 to Muntz et al. discloses a method of generating molten metal droplets from the phenomenon of capillary stream break-up, charging the droplets, and deflecting the droplets to predetermined locations on a substrate. The method of using droplets generated from capillary stream break-up is several orders of magnitude faster than the other direct write technologies; however, the method is limited by the size of the droplets that are produced.

The generation of droplets from capillary stream break-up has been studied at least as early as Lord Rayleigh in the 1800s. Using the process of capillary stream break-up, the droplets can be produced at very high rates—typically tens of thousands of droplets per second. Further, the nature of droplet formation due to capillary stream break-up results in highly uniform droplets.

However, conventional methods of formation of metal droplets by capillary stream break-up is limited to the formation of droplets having diameters in excess of 50 microns. A significant limitation on the size of metal balls produced from capillary stream break-up is the size of the orifice from which the capillary stream emerges. Typically, droplets generated from capillary stream break-up have diameters that are roughly twice as large as the diameter of the capillary stream orifice. The production of smaller balls, therefore, typically requires smaller orifices. As the orifice becomes very small, it tends to be more easily clogged by, e.g., impurities in the molten metal. Further, obtaining smaller orifices that are also uniform tends to be difficult and expensive. Current state-of-the-art provides a lower limit of orifice diameter available off-the-shelf and suitable for use with molten metals of 25 microns.

SUMMARY OF THE INVENTION

Accordingly, the present invention enables the placing of very fine metallic spheres on a substrate, e.g., direct circuit board writing, wherein the formation of the metallic microspheres is due to capillary stream break-up. The present invention further enables the formation of metallic microspheres that are significantly smaller than metallic microspheres made by conventional methods and, more particularly, to metallic micro-spheres that are significantly smaller than the capillary stream orifice from which the capillary stream emerges, thereby overcoming many of the difficulties that plagued conventional methods.

In accordance with one innovative aspect of the invention, a method of depositing metal onto a substrate comprises directing a capillary stream of molten metal from an orifice by applying an excitation disturbance, wherein the excitation disturbance is determined so that parent droplets and satellite droplets form from the stream due to capillary stream break-up; and directing at least some of the satellite droplets to predetermined locations on the substrate. The satellite droplets can be precisely directed to locations on the substrate by selectively imparting to them an electrostatic charge and passing the satellite droplets through an electric field, which deflects the droplets in predictable amounts. To facilitate the writing of the satellite droplets onto the substrate, the substrate is preferably translatable in a plane substantially orthogonal to the capillary stream (e.g., by being attached to an x-y table).

In accordance with another innovative aspect of the present invention, an electrical assembly comprises a substrate and a plurality of metal balls attached to the substrate, wherein each of the balls preferably has a diameter in a range of about 1.0 to 100 microns, and preferably less than about 25 microns. In accordance with yet another innovative aspect of the present invention, an electrical assembly comprises a substrate and a conductive trace disposed on the substrate, the conductive trace having a width or pitch in a range of about 5 to 100 microns, and preferably less than about 25 microns. The conductive traces of the present invention preferably comprise a plurality of solidified metallic droplets that have fused together to form an electrical connection therebetween.

Advantageously, the parent droplets and the satellite droplets not used may be caught in a gutter and recycled back into the system.

Thus, in accordance with the present invention, metal conductors can be printed directly onto a substrate. By employing satellite droplets instead of the parent droplets, the method can deposit very small metal balls to form very fine pitch (preferably on the order of about 10 microns) conductive trace and ball grid arrays on a substrate. Because droplets from capillary stream break-up are generated at high rates (typically on the order of tens of thousands of droplets per second), printing onto a substrate according to these methods is accomplished in less time than many other solutions. More particularly, droplets may be formed in accordance with the present invention preferably at a rate in a range of about 1000 to 200,000 droplets per second and preferably at a rate greater than 4000 droplets per second. Accordingly, conductive traces may be formed in accordance with the present invention at a rate preferably in a range of about 0.5 to 20 centimeters per second. Further, the high uniformity of droplets generated from capillary stream break-up lead to highly uniform products fabricated according to these methods (e.g., highly uniform trace widths or pitches), which increases the reliability of such products. Specifically, conductive traces may be formed in accordance with the present invention having a pitch or width tolerance in a range of about 3.5 to 5.0 percent.

Other aspects and features of the present invention will become apparent from consideration of the following description taken in conjunction with the accompanying drawings.

DETAILED DESCRIPTION OF THE PREFERRED EMBODIMENTS

In accordance with the invention, very small metal droplets, called satellite droplets, are produced at a high rate by capillary stream break-up, wherein highly uniform and predictable droplets break from a capillary stream of molten metal. The droplets may be formed from one or a combination of various metals, including solder, copper, nickel, titanium, or any metal having physical properties (e.g., melting point) suitable for the process described herein. The droplets are electrostatically charged on a droplet-by-droplet basis, and are then directed through an electric field that deflects the droplets to predetermined locations on a substrate.

Figure 1:
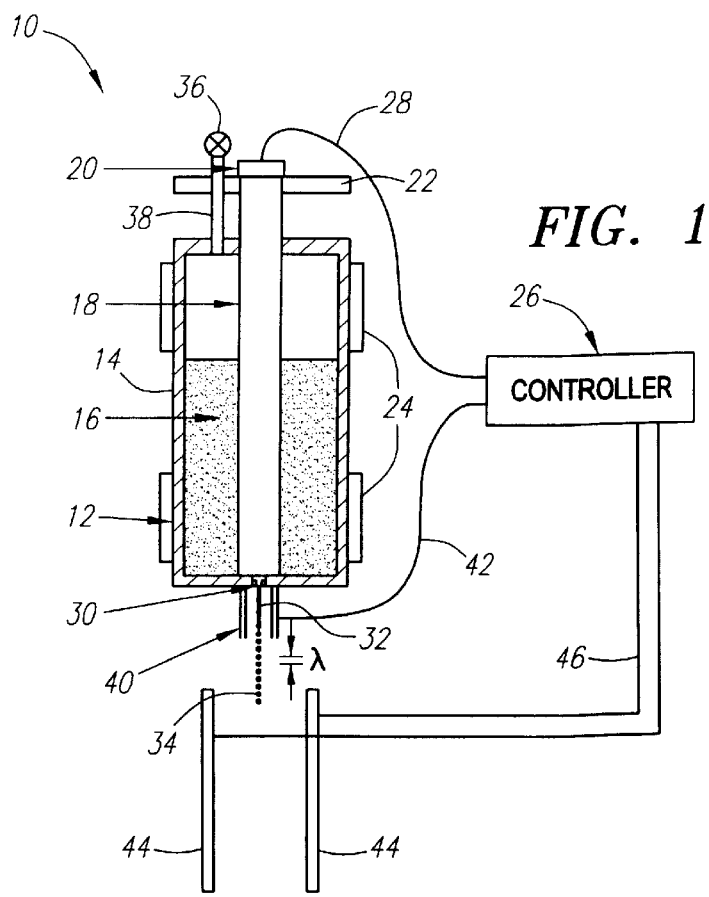
FIG. 1 is a cross sectional view of the droplet generation system.

FIG. 1 shows a system 10 for producing metal balls in accordance with one embodiment. To form a capillary stream, a droplet generator 12 is provided. One example of a droplet generator suitable for these purposes is described in U.S. Pat. 6,186,192 to Orme et al., hereby incorporated in full by reference. This patent describes a system for generating a capillary stream of molten metal, from which a continuous series of molten droplets form. Although the patent is directed to producing droplets of molten solder, any metal having a suitable melting point may be used therewith.

The droplet generator 12 includes a chamber 14 adapted to hold a reservoir of molten metal 16 therein. As explained, this molten metal comprises any metal having physical characteristics compatible with the system 10 and method described. The melting point of some metals, for example, may be too high to use with the system 10 shown in FIG. 1. A vibrating rod 18 is slidably disposed within the chamber 14, contacting the molten metal 16. The rod 18 is mechanically coupled to a piezoelectric crystal or transducer 20 and, as described, is used to impart a disturbance in the molten metal. However, it should be appreciated that a disturbance may be imparted mechanically with a piezoelectric transducer with or without a rod or plunger—for example, the piezoelectric transducer may be placed under the orifice to eliminate the rod or plunger—or a disturbance may be imparted from magnetic, electric or acoustic forces.

As shown, the piezoelectric crystal 20 is disposed outside the chamber 14 to protect it from the heat of the molten metal 16, as piezoelectric materials can be damaged if subjected to high temperatures. However, for metals with low melting points, such as solder, it may be possible to immerse the piezoelectric crystal in the molten fluid or position the piezoelectric crystal under the orifice where temperatures are high. To further protect the piezoelectric crystal 20 from heat transferred from the vibrating rod 18, a cooling jacket 22 may be attached to the vibrating rod 18, or to a housing around the rod 18, near the crystal 20 to keep it at a cooler temperature. The cooling jacket 22 may be, for example, fluidly coupled to a circulating water supply that circulates room temperature water through the cooling jacket 22. Additionally, to maintain the molten metal 16 inside the chamber 14 above its melting point, heaters 24 may be coupled to the outer wall of the chamber 14 at spaced-apart locations.

A controller 26, which may comprise one or more microprocessors and one or more power supplies, is electrically coupled to the piezoelectric crystal 20 by electrical connection 28. The controller 26 delivers an alternating electrical signal to the piezoelectric crystal 20, causing a corresponding mechanic response. The vibrating piezoelectric crystal 20 causes the vibrating rod 18, to which the crystal 20 is coupled, to oscillate. The vibrating rod 18 is preferably biased with a periodic waveform, typically with a magnitude of about 50 to 300 Volts, and a fundamental frequency which corresponds to the frequency of perturbation applied to the capillary stream for uniform droplet production, determined by the following equation:

$$f = \frac{k \cdot V}{2\pi r_o}, \tag{1.0}$$

wherein V is the droplet or stream velocity, $r_o$ is the orifice radius, and k is a non-dimensional wavenumber constant, which depends on the fluid properties of viscosity, surface tension and density, and ambient gas density. See M. Orme, "On the Genesis of Droplet Stream Microspeed Dispersions," *Physics of Fluids*, 3, (12) pp 2936–2947, 1991. The constant k tends to vary between 0.4 and 0.8; for inviscid fluids, k equals 0.697. It should be appreciated that uniform droplets may be produced at high rates and that the fundamental frequency f varies according to orifice size and stream velocity. Preferably, the fundamental frequency f and thus the droplet production rate, is in a range of about 1000 Hz to 200 kHz.

The molten metal 16 is ejected from the chamber 14 through an orifice 30 in the bottom of the chamber 14, from which a stream 32 of the molten metal forms. The oscillation of the vibrating rod 18 produces a standing wave in the molten metal 16 and in the stream 32 as it leaves the orifice 32. Due to capillary stream break-up, molten metal droplets 34 form by detaching from the stream 32. A droplet 34 formed from capillary stream break-up has a diameter typically about twice the diameter of the orifice 30. With the current state-of-the-art of off-the-shelf orifices having diameters limited to 25 microns or greater, the droplets formed from streams emerging from such orifices tend to be in excess of 50 microns. To control the formation of molten metal droplets 34 leaving the droplet generator 12, a supply 36 delivers nitrogen gas (or other inert gas, such as argon) along a gas line 38 to pressurize the chamber 14, thereby affecting the tendency of molten metal 16 to leave the chamber 14 through the orifice 30. Nitrogen (or other inert gas, such as argon) may also be supplied through a gas line to a detachable end assembly to further control solder droplets. Preferably, the inert gas is a high purity gas, such as research grade or better.

Figure 2:
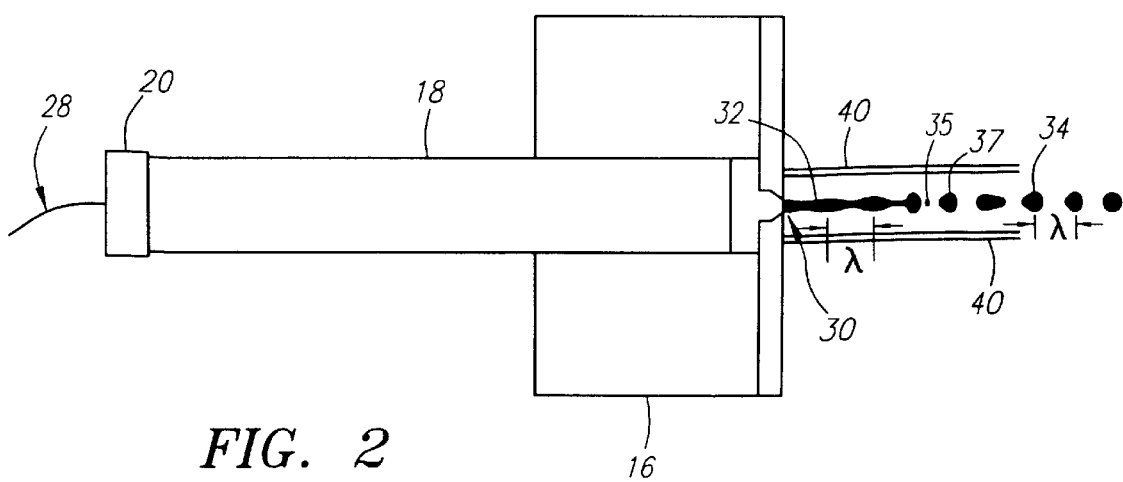
FIG. 2 is a side view of the capillary stream and satellite droplet formation.

FIG. 2 illustrates the process of generating droplets from capillary stream break-up. An axisymmetric excitation disturbance is imparted to the stream 32 whose fundamental wavelength is in the region of Rayleigh growth. As described above, the disturbance is imparted, in this embodiment, by driving the piezoelectric crystal 20, to which the vibrating rod 18 is mechanically coupled, with an electrical signal representing the disturbance via line 28.

Alternatively, as described above, the disturbance may be imparted with a piezoelectric transducer with or without a rod or plunger, or from magnetic, electric or acoustic forces. As illustrated, the disturbance grows, resulting in the standing wave on the stream 32 and causing the series of droplets 37,35 shown. The larger parent droplets 37 are typically on the order of twice the diameter of the orifice 30, whereas the smaller satellite droplets 35 have diameters much smaller than the orifice 30.

Depending on the characteristics of the excitation disturbance, a satellite droplet 35 will merge with the forward or rearward parent droplet 37 to form a merged droplet 34, or can be forced to maintain its position between the forward and rearward parent droplets 37 using an appropriate application of harmonics on the axisymmetric disturbance. An example of such a disturbance is one having second and third order harmonics, although many other disturbances are possible. In the example of FIG. 2, the satellite droplets merge with a parent droplet within one wavelength, λ, of the excitation disturbance. The merging time and the diameter of the satellite droplets can be manipulated by the waveform conditions. For example, waveforms composed of added harmonics, or waveforms with very high driving amplitudes, which effectively distort the linearity of the disturbance will affect the properties of the stellite droplets. Accordingly, the present invention uses harmonic disturbances to prevent instantaneous merging so that the satellite droplets can be deflected out of the main stream to separate the satellite droplets from the parent droplets. The diameter of the satellite droplet tends to be a function of the characteristics of the excitation disturbance, while the diameter of the parent droplet tends to be a function of the excitation disturbance and the nozzle orifice as shown by the following:

$$r_d = [r_o^3(8\pi)/(3k_o) - r_s^3] \qquad (2.0)$$

where $r_o$ is the orifice radius and $r_s$ is the satellite droplet radius.

Figure 3A:
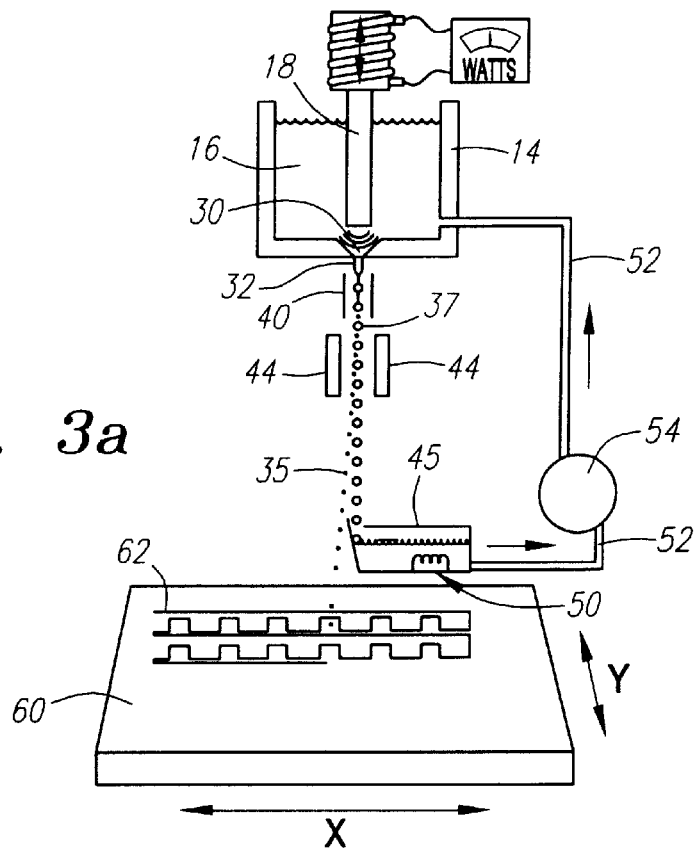
FIG. 3a is a schematic view of an embodiment for direct writing of satellite droplets.
Figure 3B:
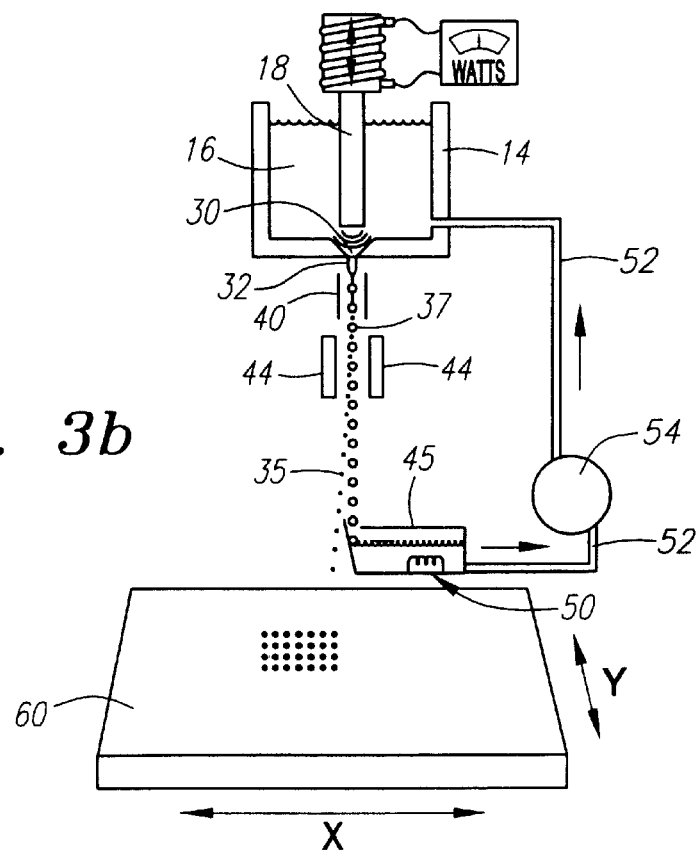
FIG. 3b is a schematic view of an embodiment for direct writing of satellite droplets.

FIGS. 3a and 3b illustrate one method of separating the satellite droplets from the parent droplets using electrostatic forces. A charge electrode 40 is located near the orifice 30 where droplets 37,35 break from the capillary stream 32. The charge electrode 40 allows for an electrostatic charge to be selectively applied to any of the droplets 37,35 on a droplet-by-droplet basis. The charge electrode 40 is coupled to the controller 26 by electrical connection 42. Because of the highly predictable nature of droplet formation from capillary stream break-up, the time at which droplets 37,35 break from the capillary stream 32 is known to a precise degree, given the function at which the piezoelectric crystal 20 is driven and other system parameters. More particularly, the perturbation on the stream's radius grows exponentially in time, t, as $r(t) = r_o \pm r_o \kappa e^{\beta t}$, where κ and β are the amplitude of the initial perturbation and the disturbance growth rate, respectively. The time at which droplets break from the capillary stream is the time when r(t)=0, i.e., when t=(1/β)ln (1/κ). See M. Orme, "On the Genesis of Droplet Stream Microspeed Dispersions," *Physics of Fluids*, 3, (12) pp 2936–2947, 1991.

Figure 4:
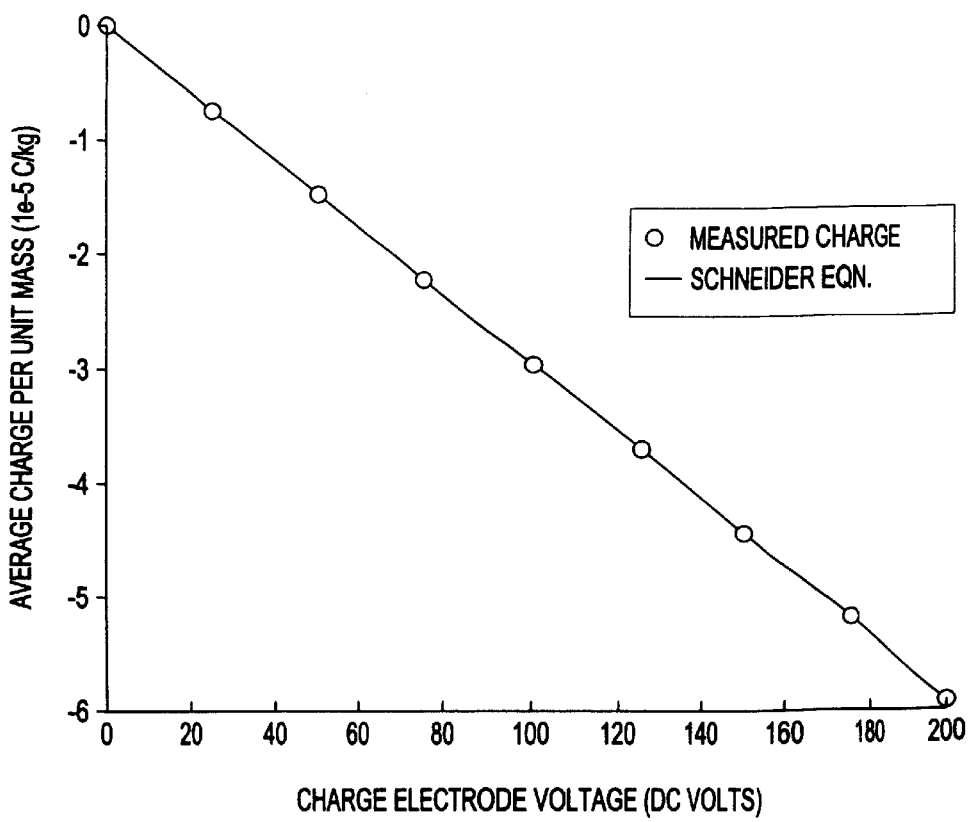
FIG. 4 is a graph of measured and theoretical droplet charge per mass versus charge electrode voltage.

It can be appreciated that an electrostatic charge on the charge electrode 40 causes a corresponding electrostatic charge on the conductive capillary stream 32. When a droplet 37,35 breaks from the stream 32, the droplet 37, 35 is effectively short circuited; therefore, the droplet 37,35 will maintain that electrostatic charge while in flight. Each droplet 37,35 can thus be selectively charged, determined by the controller 26, by charging the charge electrode 40 to a predetermined value at the time that each droplet 37,35 breaks from the stream 32. The electrostatic charge, Q, per mass, m, of each droplet is given theoretically by Schneider's Equation:

$$\frac{Q}{m} = \frac{2\pi\varepsilon_0 V_c}{\rho r_o^2 \ln(b/r_o)}, \qquad (3.0)$$

where $\varepsilon_o$ is the permitivity of free space, $V_c$ is the charge potential, p is the fluid density and b is the electrode radius. See J. M. Schneider, N. R. Lindblad, & C.D. Hendricks, "Stability of an Electrified Liquid Jet," *J. Applied Physics*. 38, 6, 2599, 1967. The graph of FIG. 4 compares measured and predicted results for the charge per unit mass of the droplets, using the apparatus and method described herein. As FIG. 4 shows, Schneider's Equation is useful to predict the charge of the droplets.

After being electrostatically charged, the droplets 37,35 of molten metal are directed to pass between a pair of deflection plates 44. The bias voltage across the deflection plates 44 is controlled by the controller 26. When a bias voltage is applied across the deflection plates 44 by electrical connections 46, it can be appreciated that an electric field is formed between the plates 44. As charged droplets 37, 35 pass between the plates 44, and thus through this electric field, the droplets 37, 35 are acted upon by an electrostatic force. The electrostatic force on a droplet is proportional to the electric field and to the charge of the droplet.

The magnitude of the electrostatic force acting on the droplet 37, 35 determines the degree to which the droplet 37, 35 is deflected from an axis defined by the capillary stream 32 and thus the path the droplet 37, 35 travels. The deflection—of a charged droplet due to the electrostatic field of a pair of deflection plates can be approximated by Fillmore's Approximation:

$$x_d = \frac{QE}{mv_0^2}l_{dp}\left(z_p - \frac{l_{dp}}{2}\right), \qquad (4.0)$$

where $l_{dp}$ is the length of the deflection plates, Q is the charge, E is the electric field strength, m is the mass, $v_o$ is the droplet speed and $z_p$ is the vertical distance between the deflection plate and the target. See G. L. Fillmore, W. L. Buehner, & D. L. West, "Drop Charging and Deflection in an Electrostatic Ink Jet Printer," *IBM J. Res. Dev.* Jan, 1977. A more accurate model that considers the effects of drag is given by the equations:

$$m\frac{dv_x}{dt} = QE - D\sin\theta \qquad (5.0)$$

$$m\frac{dv_z}{dt} = mg - D\cos\theta \qquad (5.1)$$

$$D = C_d \cdot \frac{1}{2}\rho_a v^2 \cdot A \qquad (5.2)$$

$$C_d = \frac{24}{Re} + \frac{6}{1+\sqrt{Re}} + 0.4 \qquad (5.3)$$

where D is the aerodynamic drag force, g is the gravitational constant, θ is the deflection angle measured from the undeflected stream, A is the frontal surface area of the sphere, $C_d$ is the dimensionless drag coefficient, and Re is the dimensionless Reynolds number. See Q. Liu, C. Huang, and M. Orme, "Mutual Electrostatic Charge Interactions Between Closely Spaced Charged Solder Droplets," *J. of Atomization and Sprays*, Vol. 10 no. 6, pp 565–585, 2000.

Figure 5:
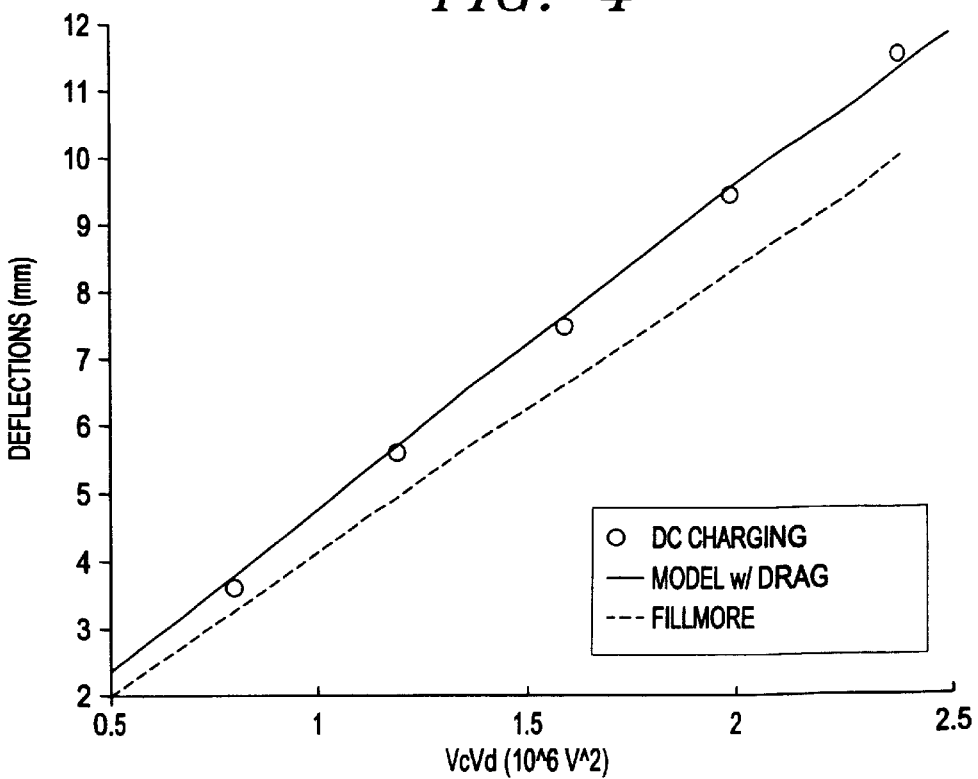
FIG. 5 is a graph of measured and theoretical droplet deflection given deflection plate biasing.

As FIG. 5 shows, this model (Equations 5.0–5.3), which incorporates drag, very accurately predicts measured deflection values. Fillmore's Approximation (Equation 4.0) also tends to indicate a droplet's deflection, although it tends to underestimate the actual deflection somewhat.

For the embodiments shown in FIGS. 3a and 3b, the satellite droplets 35 will preferably have higher charge to mass ratios than the parent droplets 37, so the electrostatic deflection of the satellite droplets 35 will be greater. Accordingly, by deflecting the satellite droplets 35 greater than the parent droplets 37, the satellite droplets 35 can be selectively directed to locations on a substrate 60 while the parent droplets 37 are caught by a gutter 45. A heater 50 may be integrated into the gutter 45 to heat the metal caught by the gutter 45 so that the metal remains in liquid form. The collected metal in the gutter 45 can be advantageously recycled back into the chamber 14 through lines 52 by pump 54. To minimize impurities, the metal is preferably filtered. The parent droplets 37 can thus be recycled back into the chamber 14 after they are collected.

As explained, the satellite droplets may be directed to predetermined locations on the substrate 60. Preferably, the substrate 60 is translatable in the direction of two orthogonal axes X and Y (e.g., by being attached to an x-y table), each of which is in a plane that is substantially orthogonal to the capillary stream 32. After being deflected by the deflection plates 44, the satellite droplets 35 impinge upon a predetermined location on the substrate 60. As described, this location is determined by setting the bias voltage of the deflection plates 44 (which, preferably, is constant), the charge on each droplet 35, and the x-y position of the substrate 60. If there are no locations suitable for locating a satellite droplet 35 on the substrate 60 at a given time, the droplet 35 is not electrostatically charged by the charge electrode 40 and falls instead into the gutter 45 to be recycled. The satellite droplets 35 may be placed at individual locations on the substrate 60, e.g., for forming a ball grid array, or they may be overlapped to form a conductive trace 62. In the latter case, thermal conditions are controlled carefully so that the newly arriving satellite droplets 35 will fuse with the trace 62 formed by previously deposited droplets 35. Because the satellite droplets may have very small diameters (e.g., on the order of 10 microns), conductive traces 62 having correspondingly small widths may be formed on the substrate 60 using this method.

Alternatively, the satellite droplets could be separated from the main stream of parent droplets by other means (e.g., using aerodynamic forces or acoustic forcing), and the resulting stationary stream of satellite droplets could be directed at a substrate that is in motion in one or two axes.

Thus, in accordance with the present invention, metal conductors can be printed directly onto a substrate. A significant advantage of the present invention is that it enables the production of micro-metallic spheres that are significantly smaller than the diameter of the orifice from which they emerge, i.e., droplets preferably in a range of about 1.0 to 100 microns and preferably less than about 25 microns. Because much smaller droplets can be produced with larger diameter orifices, the difficulties plaguing smaller orifices, such as orifice clogging, tend to be avoided with the present invention. By employing satellite droplets instead of the parent droplets, the method can deposit very small metal balls to form very fine pitch, e.g., on the order of about 10 microns, conductive traces (FIG. 3a) and ball grid arrays (FIG. 3b) on a substrate. More particularly, an electrical assembly formed in accordance with the present invention may comprise a substrate and a conductive trace disposed on the substrate, the conductive trace having a width or pitch in a range of about 5 to 100 microns, and preferably less than about 25 microns. The conductive traces of the present invention preferably comprise a plurality of solidified metallic droplets that have fused together to form an electrical connection therebetween. In an alternative embodiment of the present invention, the electrical assembly may comprise a substrate and a plurality of metal balls attached to the substrate to form, e.g., a very fine pitch ball grid array, wherein each of the balls has a diameter in a range of about 1.0 to 100 microns, and preferably less than about 25 microns.

Because droplets from capillary stream break-up are generated at high rates (typically on the order of tens of thousands droplets per second), printing or depositing onto a substrate according to these methods is accomplished in less time than many other solutions. More particularly, satellite micro-spheres or droplets may be formed in accordance with the present invention preferably at a rate in a range of about 1000 to 200,000 droplets per second and preferably at a rate greater than about 4000 droplets per second. These rates of droplet formation enable conductive traces to be formed in accordance with the present invention preferably at a rate in a range of about 0.5 to 20 centimeters per second. Further, the high uniformity of the droplets generated from capillary stream break-up lead to highly uniform products fabricated according to these methods (e.g., highly uniform trace and ball widths or pitches), which increases the reliability of such products. Specifically, conductive traces and ball grid arrays formed in accordance with the present invention have a pitch or width tolerance preferably in a range of about 3.0 to 5.0 percent.

While the invention is susceptible to various modifications and alternative forms, a specific example thereof has been shown in the drawings and is herein described in detail. It should be understood, however, that the invention is not to be limited to the particular form disclosed, but to the contrary, the invention is to cover all modifications, equivalents, and alternatives falling within the spirit and scope of the appended claims.

What is claimed is:

1. A method of depositing metal onto a substrate comprising the steps of:

forming a stream of molten droplets comprising satellite droplets and parent droplets; and directing at least a portion of the satellite droplets to predetermined locations on a substrate, wherein the directing step comprises:
imparting an electrostatic charge to at least some of the satellite droplets; and
passing the satellite droplets through an electric field, wherein the electrostatic charge for each satellite droplet and the electric field are determined to deflect each satellite droplet to land at its corresponding predetermined location on the substrate.

2. The method of claim 1 wherein the forming step further includes directing a capillary stream of molten metal from an orifice by applying an excitation disturbance, wherein the excitation disturbance is determined so that the parent and satellite droplets form from the stream due to capillary stream break-up.

3. The method of claim 1, further comprising a step of translating the substrate in at least one direction substantially orthogonal to the capillary stream.

4. The method of claim 1, further comprising the step of recycling back into the molten metal the parent droplets and the satellite droplets that are not deposited onto the substrate.

5. The method of claim 4, further comprising the step of filtering the molten metal.

\* \* \* \* \*